United States Patent [19]

Oita et al.

[11] Patent Number: 5,537,049

[45] Date of Patent: Jul. 16, 1996

[54] TEMPERATURE COMPENSATING CIRCUIT

[75] Inventors: Takeo Oita, Kawagoe; Hiroaki Mizumura, Hannou; Yoshinori Ishito, Hakodate, all of Japan

[73] Assignee: Nihon Denpa Kogyo Co., Ltd., Saitama-ken, Japan

[21] Appl. No.: 288,571

[22] Filed: Aug. 10, 1994

[51] Int. Cl.$^6$ ..................................................... H03L 1/00
[52] U.S. Cl. ........................... 324/703; 331/176; 327/513
[58] Field of Search ........................... 327/513; 331/176; 324/703

[56] References Cited

U.S. PATENT DOCUMENTS 3,322,981  5/1967  Brenig ..................................... 331/176

FOREIGN PATENT DOCUMENTS 1060922  7/1959  Germany ................................. 331/176

OTHER PUBLICATIONS

Terman: "Radio Engineers' Handbook"—1943 —pp. 354–355 and 909.

Primary Examiner—Kenneth A. Wieder
Assistant Examiner—Jose M. Solis
Attorney, Agent, or Firm—Joseph J. Petrokaitis; Christopher R. Pastel; Thomas R. Morrison

[57] ABSTRACT

A thermistor network for a low temperature component of a temperature compensating circuit includes a series resistor-capacitor combination in parallel with a thermistor and a capacitor. The presence of the capacitor in series with the resistor permits DC measurement of the resistance of the resistor without the measurement being affected by current flow through the thermistor. This low temperature component may be connected in series with a high temperature component of the temperature compensating circuit. Alternatively, the low temperature component can be connected in parallel with the high temperature component.

6 Claims, 2 Drawing Sheets

TEMPERATURE COMPENSATING CIRCUIT

BACKGROUND OF THE INVENTION

The invention relates to an electrical circuit containing temperature compensating resistor networks which stabilize the frequency of a signal generated by a crystal oscillator. Such a circuit is generally found in communications devices where frequency stabilization is essential. In particular, temperature compensating circuitry is found in communications devices that are used in a mobile environment and thus exposed to wide variations in environmental temperature. Generally, temperature compensating circuits consist of thermistors, resistors, and capacitors. Thermistors are semiconductors that vary in conductivity with changes in temperature. A thermistor has a negative coefficient of resistance.

Referring to FIG. 3, a conventional direct-type temperature compensating circuit includes a temperature compensating circuit P1 in series between ground and an AT-cut crystal oscillator P4. Temperature compensating circuit P1 includes a low-temperature compensating part P2 and a high-temperature compensating part P3 connected in series with each other. Low-temperature compensating part P2 includes a capacitor $PC_1$ and a temperature compensating resistor network $PRN_1$ connected in parallel. Temperature compensating resistor network $PRN_1$ includes a thermistor $PRT_1$ and a resistor $PR_1$ connected in parallel. High-temperature compensating part P3 includes a capacitor $PC_2$ and a temperature compensating resistor network $PRN_2$ connected in parallel. Temperature compensating resistor network $PRN_2$ includes a thermistor $PRT_2$ and a resistor $PR_2$ connected in series.

Temperature compensating circuit P1 controls the oscillation frequency of crystal oscillator P4 by capacitive loading of a crystal. The effect of the capacitance is controlled by a temperature responsive parallel resistance. As the ambient temperature decreases, the resistances of thermistors $PRT_1$ and $PRT_2$ increase. Thus, changes in the resistance of thermistor $PRT_1$ compensates the oscillation frequency of crystal oscillator P4 at low temperatures. The relatively high resistance of the series combination of resistor $PR_2$ and thermistor $PRT_2$ makes high-temperature compensating part P3 relatively ineffective at low temperatures. At higher-than-ambient temperatures, the low resistance of thermistor $PRT_1$ dominates the resistance of the parallel combination of thermistor $PRT_1$ and resistor $PR_1$, while the decreasing resistance of thermistor $PRT_2$ compensates the oscillation frequency of crystal oscillator P4 at high temperatures.

Referring now to FIG. 4, a frequency-temperature profile depicts the normalized frequency deviation versus temperature for both compensated and uncompensated circuits. An uncompensated circuit produces a cubic polynomial curve as shown by curve A. A direct-type temperature compensating circuit produces a relatively flat curve as shown by curve B.

Low-temperature compensating part P2 functions at lower than ambient temperatures (25° C.), and high-temperature compensating part P3 functions at greater than ambient temperatures, thereby maintaining the oscillation frequency at high and low temperatures close to the oscillation frequency at a reference ambient temperature.

The imaginary part of the impedance between terminals a and b or terminals c and d depends upon the capacitances of capacitors $PC_1$ and $PC_2$ in parallel with their respective resistor networks in low-temperature compensating part P2 and high-temperature compensating part P3. The effects of the capacitors between terminals a and b and between terminals c and d vary with the change of resistance in temperature compensating resistor networks $PRN_1$ and $PRN_2$. Therefore, the frequency-temperature profile depends on the capacitances of capacitors $PC_1$ and $PC_2$ and the characteristics of temperature compensating resistor networks $PRN_1$ and $PRN_2$.

Theoretically, a flat compensation profile can be obtained. In practice, however, it is difficult to determine the proper values for temperature compensating resistor networks $PRN_1$ and $PRN_2$ and capacitors $PC_1$ and $PC_2$. As a result, the values for resistors $PR_1$ and $PR_2$ are determined by repeated trial and error until the desired compensation profile is obtained.

In a typical measuring procedure, certain initial resistors are used as resistors $PR_1$ and $PR_2$ in a circuit. The temperature is varied systematically while an initial compensation profile is measured. New resistance values are calculated based upon the initial resistance values and profile results, and new resistors are installed in the circuit. These trial and error procedures are repeated until a proper compensation profile is obtained. Having to determine the resistance values by this method decreases productivity and increases the production cost of the final product.

Another procedure uses chip resistors whose resistances are changed with a laser beam. Instead of replacing resistors in the testing circuit, the resistance of the chip resistor is adjusted by laser cut to obtain the proper compensation profile. However, although the resistance of resistor $PR_2$ is easily measured, it is impossible to measure the resistance of resistor $PR_1$ since it is in parallel with thermistor $PRT_1$. The resistance value cannot therefore be easily duplicated in a similar circuit.

OBJECTS AND SUMMARY OF THE INVENTION

Accordingly, it is an object of the invention to provide a temperature compensating circuit which overcomes the drawbacks of the prior art.

It is a further object of the invention to provide a temperature compensating circuit which permits precise measurement of the resistance of a resistor connected in parallel with a thermistor.

It is another object of the invention to provide a temperature compensating circuit which can be easily manufactured at a lower cost.

Briefly stated, the invention provides a thermistor network for a low temperature component of a temperature compensating circuit which includes a series resistor-capacitor combination in parallel with a thermistor and a capacitor. The presence of the capacitor in series with the resistor permits DC measurement of the resistance of the resistor without the measurement being affected by current flow through the thermistor. This low temperature component may be connected in series with a high temperature component of the temperature compensating circuit. Alternatively, the low temperature component can be connected in parallel with the high temperature component.

According to an embodiment of the invention, a low temperature component of a temperature compensating circuit includes a thermistor, a resistor, and a capacitor in series with the resistor to form a series resistor-capacitor combination. A thermistor network includes the series resistor-capacitor combination in parallel with the thermistor. The invention includes means for permitting measurement access to the ends of the resistor, whereby the capacitor permits DC measurement of the resistance of the resistor without the DC measurement being interfered with by parallel current flow through the thermistor.

According to another embodiment of the invention, the circuit further includes a second capacitor in parallel with the thermistor network. The second capacitor may instead be in series with the thermistor network if the low temperature component is in parallel with the high temperature component. The resistor may be one of adjustable chip type, fixed type, and printed type.

According to another embodiment of the invention, a temperature compensating circuit includes a low temperature compensating part in parallel with a high temperature compensating part and a capacitor. The low temperature compensating part includes a first thermistor network in series with a capacitor. The first thermistor network includes a first branch in parallel with a second branch. The first branch includes a thermistor, and the second branch includes a resistor in series with a capacitor.

The high temperature compensating part includes a second thermistor network in series with a capacitor. The second thermistor network includes a second thermistor in series with a second resistor. The invention includes means for permitting measurement access to the ends of the first resistor, whereby the series capacitor permits DC measurement of the resistance of the resistor without the DC measurement being interfered with by parallel current flow through the first thermistor. The invention also includes means for permitting measurement access to the ends of the second resistor.

The above and other objects and advantages of the present invention will become apparent from the following description read in conjunction with the accompanying drawings, in which like reference numerals designate the same element.

DETAILED DESCRIPTION OF THE PREFERRED EMBODIMENT

Figure 1:
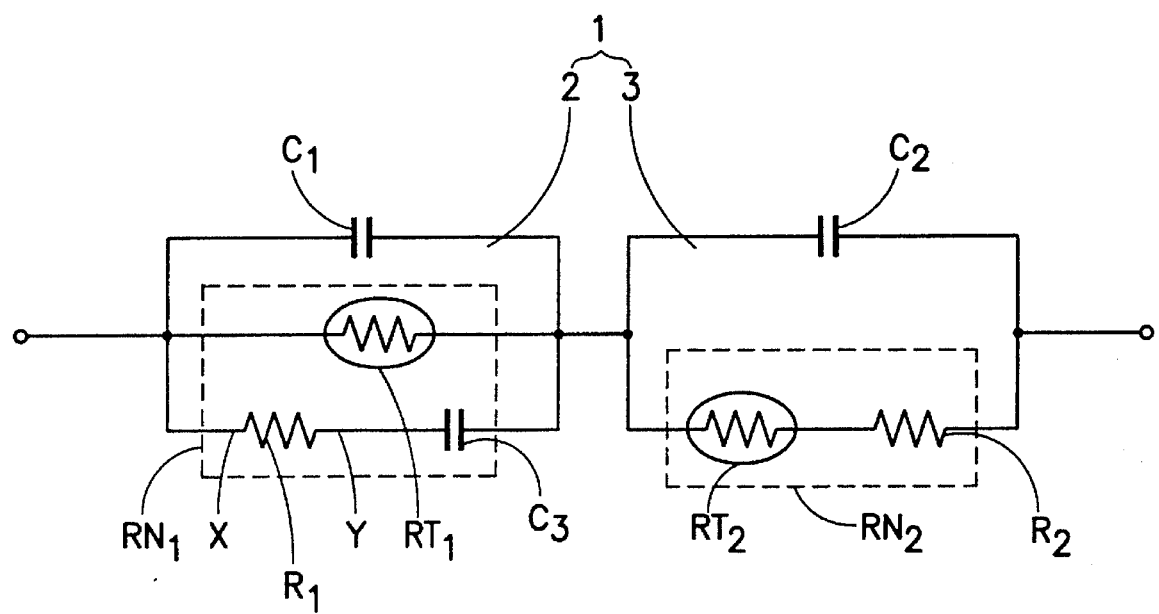
FIG. 1 shows a circuit diagram of temperature compensating circuit according to an embodiment of the invention.

Referring to FIG. 1, a temperature compensating circuit 1 includes a low temperature compensating part 2 connected in series with a high temperature compensating part 3. Low temperature compensating part 2 contains a first thermistor network $RN_1$ connected in parallel with a first capacitor $C_1$. High temperature compensating part 3 contains a second thermistor network $RN_2$ connected in parallel with a second capacitor $C_2$.

Low temperature compensating part 2 is effective at temperatures lower than a reference temperature, for example, 25° C. High temperature compensating part 3 is effective at greater than the reference temperature.

First thermistor network $RN_1$ includes a thermistor $RT_1$ connected in parallel with a resistor $R_1$ in series with a third capacitor $C_3$. At all oscillation frequencies of the crystal oscillator (not shown in FIG. 1), third capacitor $C_3$ presents negligible impedance. Thus, to an RF signal, the series combination of first chip resistor $R_1$ and third capacitor $C_3$ has an impedance that is approximately equal to that of first chip resistor $R_1$ alone. Third capacitor $C_3$ prevents a direct current flow through first chip resistor $R_1$, thereby permitting direct measurement of the resistance of first chip resistor $R_1$ at externally accessible test points X and Y unhindered by first thermistor $RT_1$. The second thermistor network $RN_2$ includes a second chip resistor $R_2$ connected in series with a thermistor $RT_2$. First and second chip resistors $R_1$ and $R_2$ have adjustable resistances.

An acceptable compensation profile is obtained by using repeated measurements and calculations. The procedure is greatly simplified because first and second chip resistors $R_1$ and $R_2$ can be easily adjusted during the process. Once the acceptable compensation profile is obtained, the resistance values of first and second chip resistors $R_1$ and $R_2$ are easily measured.

Under direct current conditions, first chip resistor $R_1$ and first thermistor $RT_1$ are not connected in parallel because of the presence of third capacitor $C_3$. The real value of the resistance of first chip resistor $R_1$ can be measured. Since the resistance of first and second chip resistors $R_1$ and $R_2$ can be measured, standard values of resistance which provide a standard compensation profile are easily determined. These values are then used in manufacturing the temperature compensating circuit of temperature compensating crystal oscillator circuits.

Chip resistors whose resistances are adjustable are used for first and second chip resistors $R_1$ and $R_2$ while the acceptable compensation profile is being determined. Once the manufacturing process is begun, adjustable type chip resistors may be used or fixed type resistors may be used. Resistors printed on a substrate may also be used for the resistors.

Figure 2:
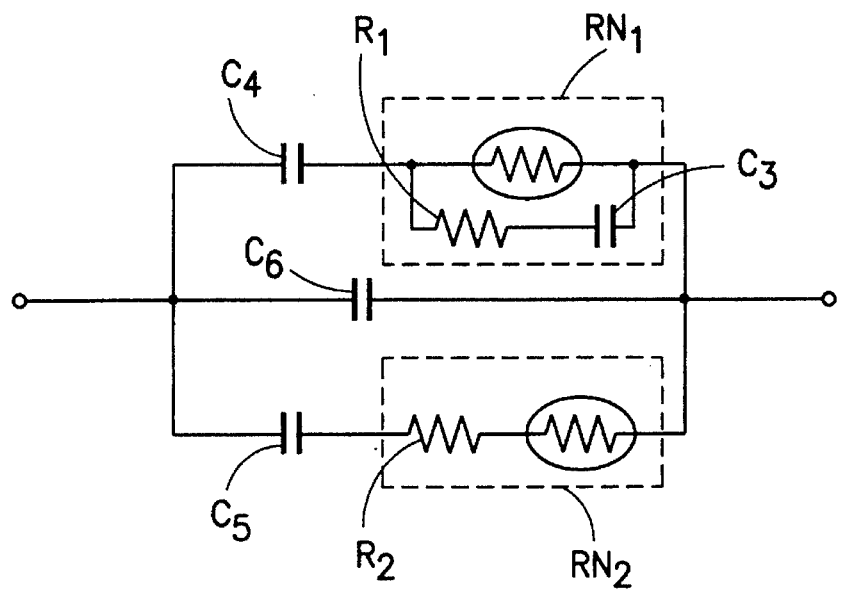
FIG. 2 shows a circuit diagram according to a second embodiment of the invention.
Figure 3:
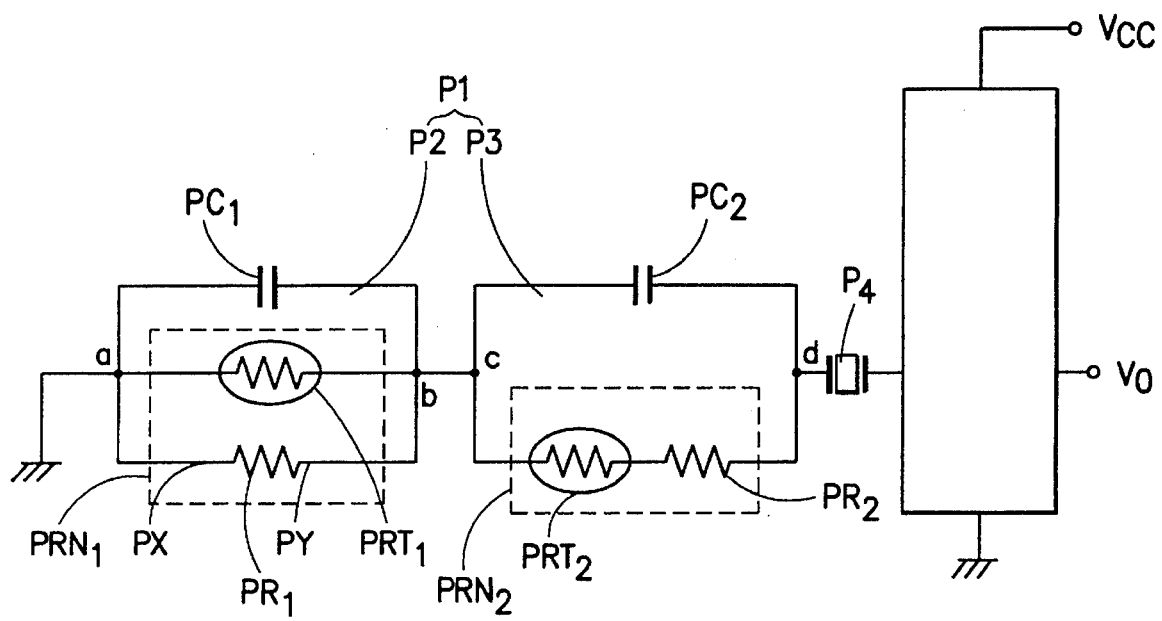
FIG. 3 shows a circuit diagram of a temperature compensating crystal oscillator in the prior art.
Figure 4:
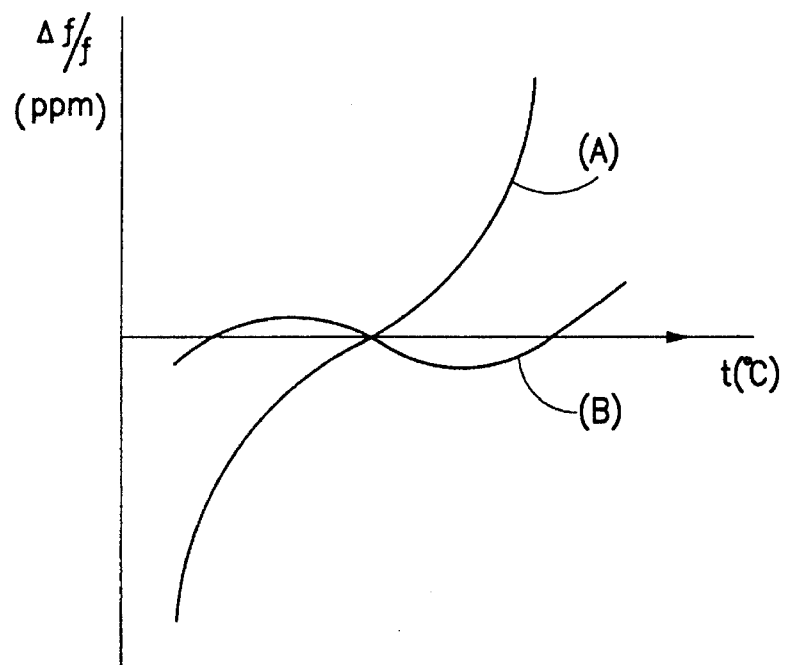
FIG. 4 shows the frequency-temperature profile for both compensated and uncompensated circuits.

FIG. 2 depicts a second embodiment using first and second thermistor networks $RN_1$ and $RN_2$. First thermistor network $RN_1$ and a fourth capacitor $C_4$ are in series between terminals to form a low temperature compensating part. Second thermistor network $RN_2$ and a fifth capacitor $C_5$ are in series to form a high temperature compensating part. The low temperature compensating part and the high temperature compensating part are in parallel with a sixth capacitor $C_6$. This embodiment eliminates all direct current flow in the temperature compensating part of the oscillator circuit. This is valuable to permit direct DC measurement of first chip resistor $R_1$ in first thermistor network $RN_1$.

The invention is not limited to use with a temperature compensating crystal oscillator. It can be used in place of any device which uses thermistors and resistors to compensate for temperature profile. Any element having a profile of change of resistance with temperature similar to a thermistor may be used in an embodiment.

Having described preferred embodiments of the invention with reference to the accompanying drawings, it is to be understood that the invention is not limited to the precise embodiments and that various changes and modifications may be affected therein by one skilled in the art without departing from the scope or spirit of the invention which is limited only by the appended claims.

What is claimed is:

1. A low temperature component of a temperature compensating circuit, comprising:

a thermistor;

a resistor;

a capacitor in series with said resistor to form a series resistor-capacitor combination;

a thermistor network consisting of said series resistor-capacitor combination in parallel with said thermistor; and means for permitting measurement access to ends of said resistor, whereby said capacitor permits DC measurement of a resistance of said resistor without said DC measurement being interfered with by parallel current flow through said thermistor.

2. A circuit according to claim 1, further comprising a second capacitor in parallel with said thermistor network.

3. A circuit according to claim 1, wherein said resistor is one of adjustable chip type, fixed type, and printed type.

4. A temperature compensating circuit, comprising:

a low temperature compensating portion including a first thermistor, a first resistor, a first capacitor in series with said first resistor to form a series resistor-capacitor combination, a first thermistor network consisting of said series resistor-capacitor combination in parallel with said first thermistor, means for permitting measurement access to ends of said first resistor, whereby said first capacitor permits DC measurement of a resistance of said first resistor without said DC measurement being interfered with by parallel current flow through said first thermistor, and a second capacitor in parallel with said first thermistor network;

a high temperature compensating portion including a second thermistor network consisting of a second thermistor in series with a second resistor, and a third capacitor in parallel with said second thermistor network; and said low temperature compensating portion in series with said high temperature compensating portion.

5. A temperature compensating circuit, comprising:

a low temperature compensating part including a first thermistor network in series with a first capacitor;

said low temperature compensating part being in parallel with a high temperature compensating part and with a second capacitor;

said high temperature compensating part including a second thermistor network in series with a third capacitor;

said first thermistor network including a first branch in parallel with a second branch;

said first branch including a first thermistor;

said second branch including a first resistor in series with a fourth capacitor;

said second thermistor network including a second thermistor in series with a second resistor;

means for permitting measurement access to ends of said first resistor, whereby said fourth capacitor permits DC measurement of a first resistance of said first resistor without said DC measurement being interfered with by parallel current flow through said first thermistor; and means for permitting measurement access to ends of said second resistor.

6. A circuit according to claim 5 wherein each of said first and second resistors are one of adjustable chip type, fixed type, and printed type.

* * * * *